(12) United States Patent
Flake

(10) Patent No.: US 6,360,935 B1
(45) Date of Patent: Mar. 26, 2002

(54) APPARATUS AND METHOD FOR ASSESSING SOLDERABILITY

(75) Inventor: Robert H. Flake, Austin, TX (US)

(73) Assignee: Board of Regents of the University of Texas System, Austin, TX (US)

( * ) Notice: Subject to any disclaimer, the term of this patent is extended or adjusted under 35 U.S.C. 154(b) by 0 days.

(21) Appl. No.: 09/237,774

(22) Filed: Jan. 26, 1999

(51) Int. Cl.[7] ............................................. B23K 31/12
(52) U.S. Cl. ................... 228/103; 228/102; 73/204.23; 73/432.1
(58) Field of Search ................................ 228/103, 104; 73/204.23, 432.1

(56) References Cited

U.S. PATENT DOCUMENTS

| | | | |
|---|---|---|---|
| 4,227,415 A | | 10/1980 | Spirig ........................ 73/432 R |
| 4,409,333 A | | 10/1983 | Tosima et al. .................. 436/2 |
| 4,467,638 A | | 8/1984 | Greenstein ................... 73/64.4 |
| 4,657,169 A | * | 4/1987 | Dostoomian et al. ........ 228/103 |
| 4,657,196 A | * | 4/1987 | Dostoomian et al. ........ 228/103 |
| 4,696,104 A | * | 9/1987 | Vanzetti et al. ................ 29/840 |
| 4,792,683 A | * | 12/1988 | Chang et al. ................ 250/341 |
| 4,941,256 A | * | 7/1990 | Capson et al. ................ 29/833 |
| 5,089,700 A | * | 2/1992 | Sapia et al. .................. 250/330 |
| 5,118,945 A | * | 6/1992 | Winschuh et al. .......... 250/341 |
| 5,148,375 A | * | 9/1992 | Horikami .................... 364/552 |
| 5,206,705 A | | 4/1993 | Tokura ........................ 356/376 |
| 5,208,528 A | * | 5/1993 | Quintard .................. 324/158 R |
| 5,246,291 A | * | 9/1993 | Lebeau et al. ................. 374/5 |
| 5,250,809 A | * | 10/1993 | Nakata et al. .............. 250/330 |
| 5,262,022 A | | 11/1993 | Tench et al. ............. 204/153.1 |
| 5,357,346 A | | 10/1994 | Piekarski et al. ........... 356/448 |
| 5,401,380 A | | 3/1995 | Tench et al. ................ 204/434 |
| 5,407,275 A | * | 4/1995 | Long .............................. 374/5 |
| 5,425,859 A | | 6/1995 | Tench et al. ............. 204/153.1 |
| 5,446,549 A | * | 8/1995 | Mazumder et al. ......... 356/376 |
| 5,574,801 A | * | 11/1996 | Collet-Beillon ............. 382/150 |
| 5,676,302 A | * | 10/1997 | Petry, III ..................... 228/104 |
| 5,836,504 A | * | 11/1998 | Koike et al. ................. 228/103 |
| 5,912,984 A | * | 6/1999 | Michael et al. ............. 382/149 |
| 5,963,662 A | * | 10/1999 | Vachtsevanos et al. ..... 382/150 |
| 5,971,249 A | * | 10/1999 | Berkin ........................ 228/102 |
| 5,988,487 A | * | 11/1999 | MacKay et al. ............. 228/254 |

FOREIGN PATENT DOCUMENTS

| | | | | |
|---|---|---|---|---|
| EP | 0849940 A | * | 6/1991 | ................. 374/4.5 |
| JP | 03140852 | * | 6/1991 | ................. 374/4.5 |

OTHER PUBLICATIONS

Humpston et al., Principles of Soldering and Brazing, ASM International, p. 58, Mar. 1993.*

* cited by examiner

Primary Examiner—Tom Dunn
Assistant Examiner—Lynne Edmondson
(74) Attorney, Agent, or Firm—Taylor Russell & Russell, P.C.

(57) ABSTRACT

The invention is an apparatus and method for assessing the solderability of electronic component leads and adjacent mounting surfaces. The apparatus and method enables assessment of solderability of fine pitch surface mount components that may be "leadless" or have such small leads that other methods are unable to make measurements required for assessing solderability. The invention also provides a reliable automated test technology for electronic component solderability. It is based on the use of measurements of the distinctive changes in the IR radiation signal of a wetted soldered connection during the solder reflow process, resulting from rapid changes in emissivity of the materials. This is accomplished through the use of an IR camera connected to a computer, and a substrate heater controlled by the computer to achieve a predetermined temperature profile at the component leads.

26 Claims, 12 Drawing Sheets

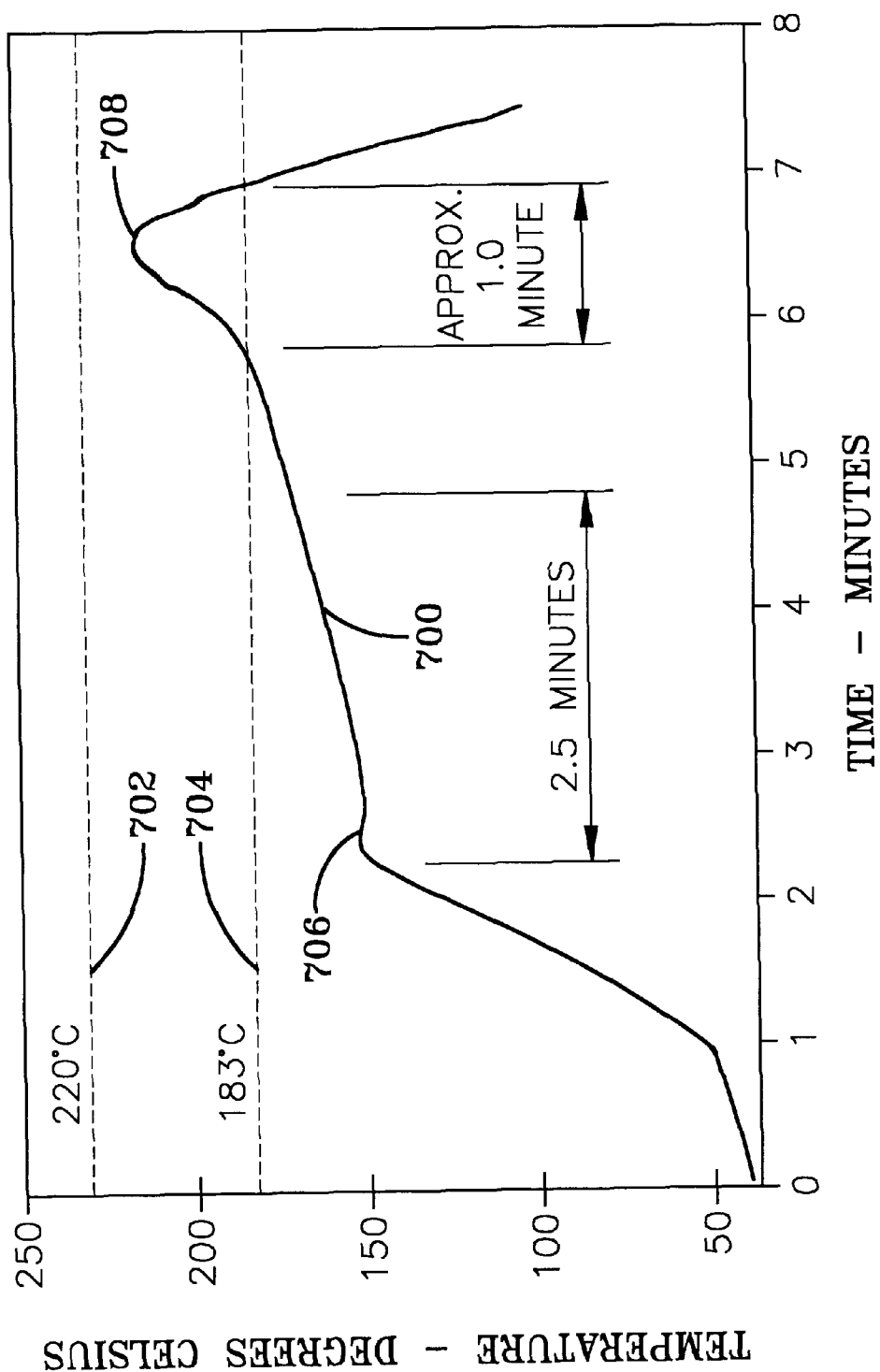

APPARATUS AND METHOD FOR ASSESSING SOLDERABILITY

BACKGROUND

The invention relates generally to electronic manufacturing technology and, more particularly, to a solderability test apparatus for electronic components and its method of use for determining solderability.

A primary requirement of the manufacturing technology that is the underpinning of the electronics industry is the need to produce printed circuit boards having high quality and high reliability in a cost-effective manner with minimal rework. The problems encountered in meeting these requirements have been compounded by the rapid change of packaging technology from through-hole mounting to surface mounting of electronic components with very fine lead pitch that require "pick and place" mechanisms or other robotic means for accurate placement. Poor solderability of these components, or the surface onto which the components are mounted, such as a printed wiring board or ceramic substrate, lead to solder joint failure and ultimately to printed circuit board or ceramic substrate failure. A high priority in avoiding rework is crucial in this industry. Good solderability is a necessary factor in obtaining a wide enough process window to avoid rework. In the past, several different methods were developed to measure solderability of through-hole components.

A previous qualitative method for assessing solderability of component was developed for through-hole leaded components, and consists of a manual "dip and look" test to determine if the component leads would or would not accept solder. This method involves dipping a component or printed wiring board into a pot of molten solder and examining the resulting soldered portion for the amount of wetted area. This solderability assessment is also based on the amount of nonwetted or dewetted area. As such, it tends to be subjective, dependent on the objectivity and interpretation of the operator, and therefore, not always reliable. Also very subjective and not always reliable is visual observation of a soldered connection for providing some assessment of solderability. These early qualitative approaches are no longer adequate for the electronics manufacturing industry.

Another method for assessing solderability is through the use of a wetting balance. This method is considered to be quantitative and is based on a time profile of the changes of forces exerted on a component or a mounting surface when dipped into a pot of molten solder. These forces include those resulting from buoyancy of the component or mounting surface due to displacement of the solder when dipped into the solder pot, and to changes in surface tension as the solder adheres to the component or mounting surface. The slope of the time profile curve and the time required to reach maximum force are important parameters for assessing solderability. The use of the wetting balance suffers from the inability to assess solderability of the newer fine-pitch surface mount components which may be leadless or have such small leads that the wetting balance is unable to make the measurements required to assess solderability.

Yet another method sometimes used for assessing solderability is sequential electrochemical reduction analysis, commonly referred to as SERA. Using this technique, a time profile of the voltage across a component lead or mounting surface is produced as an electric current is passed through the component lead or mounting surface and the oxides on the component or mounting surface are reduced by electrochemical means. Similar to the wetting balance method, the slope of the time profile curve and the time to reach a minimum voltage are important parameters for assessing solderability. This method suffers from drawbacks such as not all tin oxides reduce the same, organic solderability barriers affect the results, and different results are produced by different metals, while the noble metals do not work at all. This method does not work with small surfaces such as surface mount component leads.

Because of these limitations of existing solderability methods, there is a current 25 critical need in the electronics industry for a reliable and quantitative method and apparatus to assess the solderability of newer fine-pitch surface mount packages that may be "leadless" or have such small leads that other methods are unable to make the measurements required for assessing solderability. There is also a need for an apparatus and method that provides a reliable solderability assessment for all tin oxides without being affected by organic solderability barriers, and that provides consistent results with all base metals. Furthermore, there is also a need for an apparatus and method that provides a reliable automated solderability assessment technology for these components.

SUMMARY

The present invention is directed to an apparatus and method of use that satisfies these needs. The present invention provides for a reliable and quantitative method and apparatus to assess the solderability of newer fine-pitch surface mount components that may be leadless or have such small leads that other methods are unable to make the measurements required for assessing solderability. It also provides a method and apparatus that gives a reliable solderability assessment for all tin oxides without being affected by organic solderability barriers, and that gives consistent results with all base metals. The present invention also provides a reliable automated solderability assessment technology for these components.

The present invention provides a new methodology and apparatus for reliably and quantitatively assessing solderability of electronic components and mounting surfaces, addressing a critical need in the electronics industry. This invention is based on the use of the distinctive pattern in the infrared (IR) signature or radiation signal of a connection prior to and during wefting in a solder reflow process. The apparatus for assessing solderability comprises a mounting surface that is prepared by depositing solder paste on the surface. An electronic component is positioned onto the deposited solder paste. A means is provided for heating the mounting surface to a temperature that causes the solder paste to reflow. An IR camera or similar detector is positioned to view an image of the electronic component and the mounting surface, focusing on a component lead and the mounting surface. The heated IR radiation signal at a point in the image represents the radiation from that location on the component or mounting surface. When an ambient (unheated) IR radiation signal is subtracted from the heated IR radiation signal, the resulting IR radiation signal is dependent only on the temperature (above ambient) and the emissivity characteristics of the location of focus on the component lead and mounting surface. The parameter of interest when assessing solderability is the emissivity of the surface of the component connection. The emissivity of this connection varies when it is undergoing wetting by the molten solder, as monitored by the IR radiation signal. By recording selective pixels in the IR image that represent the component connection, a time profile of the IR radiation signals may be created that provides a basis for a solderability assessment.

A device having features of the present invention is an apparatus for assessing solderability, comprising a means for positioning a component having at least one lead on a solder paste deposit on a substrate, a means for heating the component, the component lead, the solder paste deposit, and the substrate, a means for measuring an IR radiation signal at the component lead and the substrate, and a means for determining acceptable solderability from the IR radiation signal. The means for heating may comprise a substrate heater positioned under the substrate. Power to the substrate heater may be adjusted in a controlled manner for achieving a predetermined temperature profile. The means for heating may comprise an IR radiation source. Power to the IR radiation source may be adjusted in a controlled manner for achieving a predetermined temperature profile. The means for measuring an IR radiation signal may comprise a device selected from the group consisting of an IR camera and an IR detector. The means for measuring an IR radiation signal may comprise capturing and storing in a computer memory gray level values at pixel locations in an IR image corresponding to locations on the lead and the substrate. The means for determining acceptable solderability from the IR radiation signal may comprise visually determining a peak magnitude value, visually determining a valley magnitude value, and computing a peak ratio. The means for determining acceptable solderability may further comprise comparing the peak ratio to predetermined peak ratio limit values. Acceptable solderability may be where the peak ratio is greater than a predetermined limit value of between 0.20 and 0.60. The means for determining acceptable solderability from the IR radiation signal may comprise visually determining a lead magnitude value at a temperature of less than 170° C., visually determining a substrate magnitude value at the temperature of less than 170° C., and computing a lead/substrate ratio. The means for determining acceptable solderability may further comprise comparing the lead/substrate ratio to predetermined lead/substrate ratio limit values. Acceptable solderability may be where the lead/substrate ratio is less than a predetermined limit value of between 0.40 and 0.60. The means for determining acceptable solderability from the IR radiation signal may comprise a computer image digitizer for converting the IR radiation signal into a digital code, a computer program for reading the converted IR radiation signal from the image digitizer and storing the digital code into computer memory, a computer program for detecting a sudden peak followed by a sudden valley in the converted IR radiation signal, a computer program for determining if a peak magnitude and a time from initiation of the sudden peak to the sudden peak are within predetermined limits, a computer program for determining if a valley magnitude value and a time from the sudden peak to the sudden valley are within predetermined limits, and a computer program for computing a peak ratio. The means for determining acceptable solderability may further comprise a computer program for comparing the peak ratio to predetermined peak ratio limit values. Acceptable solderability is where the peak ratio is greater than a predetermined limit value of between 0.20 and 0.60. The means for determining acceptable solderability from the IR radiation signal may comprise a computer image digitizer for converting the IR radiation signal into a digital code, a computer program for reading the converted IR radiation signal from the image digitizer and stores the digital code into computer memory, a computer program for determining a lead magnitude value at a temperature of less than 170° C., a computer program for determining a substrate magnitude value at the temperature of less than 170° C., and a computer program for computing a lead/substrate ratio. The means for determining acceptable solderability may further comprise a computer program for comparing the lead/substrate ratio to predetermined lead/substrate ratio limit values. Acceptable solderability may be where the lead/substrate ratio is less than a predetermined limit value of between 0.40 and 0.60.

Another embodiment of the present invention is an apparatus for assessing solderability, comprising a component having at least one lead positioned on a solder paste deposit on a substrate, the substrate being positioned on a substrate heater for heating the substrate, the component, and the component lead, an IR camera positioned for viewing the substrate, the component, and the component lead, and a computer connected to the IR camera for determining a change in the IR radiation signal resulting from solder flux and liquid solder wetting the component lead. The apparatus may further comprise a variac connected to a power source and the substrate heater for manually adjusting a temperature of the substrate, the component, and the component lead. An operator may adjust the temperature of the substrate, the component, and the component lead in a controlled manner for achieving a predetermined temperature profile. The apparatus may further comprise a substrate heater power supply connected to a power source, the substrate heater, and the computer for automatically adjusting a temperature of the substrate, the component, and the component lead. The computer may adjust the temperature of the substrate, the component, and the component lead in a controlled manner for achieving a predetermined temperature profile. The apparatus may further comprise a data acquisition subsystem connected to thermocouples on the substrate, the output of a substrate heater power supply, and the computer for monitoring temperature and substrate heater power. The apparatus may further comprise an x-y table supporting the substrate for positioning the component, the component leads, and the substrate under the view of the IR camera. The apparatus may further comprise a video cassette recorder and a video monitor for recording and playing back time profiles of IR radiation signals from the IR camera. The computer may comprise an image digitizer for converting the IR radiation signal from the IR camera into a digital code, and a computer program comprising a means for reading the digital code, determining a peak magnitude value, determining a valley magnitude value, and computing a peak ratio value. The computer program may further comprise a means for comparing the computed peak ratio value with predetermined ratio values for determining solderability. The computer may comprises an image digitizer for converting the IR radiation signal from the IR camera into a digital code, and a computer program comprising a means for reading the digital code, determining a lead magnitude value, determining a substrate magnitude value, and computing a lead/substrate ratio value. The computer program may further comprise a means for comparing the computed lead/substrate ratio value with predetermined ratio values for determining solderability.

Another embodiment of the present invention is a method for assessing solderability, comprising positioning a component having at least one lead on a solder paste deposit on a substrate, heating the component, the component lead, the solder paste deposit, and the substrate, measuring an IR radiation signal at the component lead and the substrate, and determining acceptable solderability from the IR radiation signal. The heating step may comprise measuring a temperature at the substrate and adjusting the power to the substrate heater under computer control for achieving a predetermined temperature profile. The measuring step may comprise capturing and storing in a computer memory gray level values at pixel locations in an IR image corresponding to locations on the lead and the substrate. The determining step may comprise reading the IR radiation signals into a computer memory, detecting a sudden peak followed by a sudden valley in the IR radiation signal, determining if a peak magnitude value and a time from initiation of the sudden peak to the sudden peak are within predetermined peak limits, and determining if a valley magnitude value and a time from the sudden peak to the sudden valley are within predetermined valley limits. The determining step may further comprise computing a peak ratio value, and comparing the peak ratio value to predetermined ratio values. The determining step may further comprise computing a lead/substrate ratio value, and comparing the lead/substrate ratio value to predetermined ratio values.

Another embodiment of the present invention is a method for assessing solderability, comprising characterizing a solder paste reflow profile and solderability acceptability and unacceptability of a component type during an initial time interval of a reflow temperature profile up to a maximum temperature of 170° C., determining predetermined upper and lower limits for an IR signal during the initial time interval of the temperature profile prior to reflow from a component lead with acceptable solderability and from a component lead with unacceptable solderability, and comparing an IR signal from a component lead of other components of the same component type during the initial time interval with the predetermined IR signal limits for determining solderability acceptability or unacceptability. The characterizing step may comprise reading the IR radiation signal from a component lead of the same component type into a computer memory, detecting a sudden peak followed by a sudden valley in the IR radiation signal, and determining acceptable solderability by determining if a peak magnitude value and a time from initiation of the sudden peak to the sudden peak are within predetermined peak limits, and if a valley magnitude value and a time from the sudden peak to the sudden valley are within predetermined valley limits.

Another embodiment of the present invention is an apparatus for assessing solderability, comprising a printed circuit board having at least one solder pad having a surface that is partially covered with a solder paste deposit, a means for heating the printed circuit board, the solder pad, and the solder paste deposit, a means for measuring an IR radiation signal at a part of the solder pad surface that is not covered with the solder paste deposit, and a means for determining a change in the IR radiation signal resulting from solder flux and liquid solder wetting the solder pad surface.

BRIEF DESCRIPTION OF THE DRAWINGS

These and other features, aspects, and advantages of the present invention will become better understood with regard to the following description, appended claims, and accompanying drawings where:

FIG. 3 shows a typical temperature profile for solder reflow processing as recommended by a solder paste manufacturer;

DETAILED DESCRIPTION

Figure 1:
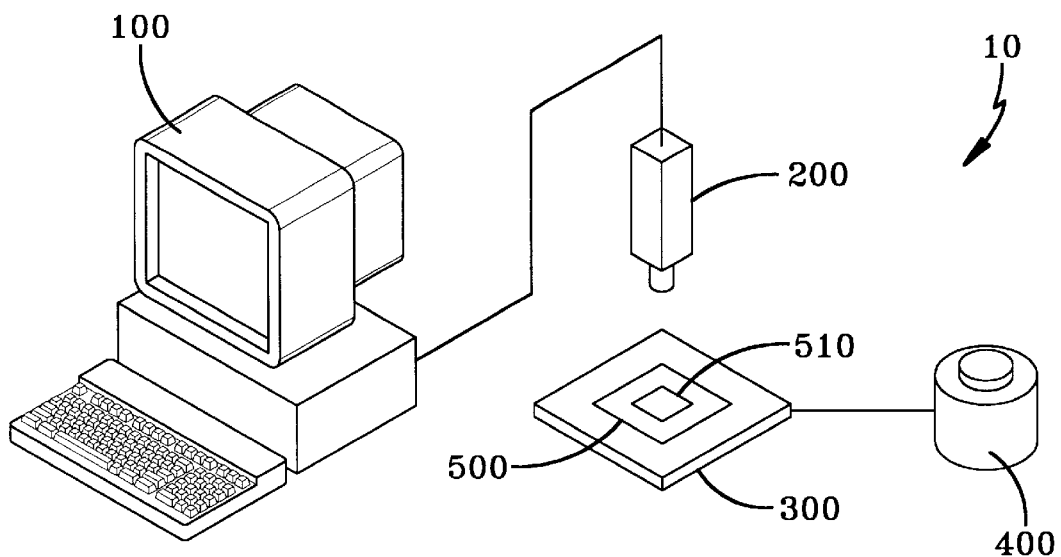
FIG. 1 shows a simplified configuration of an apparatus for assessing solderability.

Turning now to FIG. 1, FIG. 1 shows a simplified configuration of an apparatus for assessing solderability based on a measurement of a distinctive IR radiation signal of the solder reflow process during wetting of the soldered connection. The solderability assessment apparatus 10 comprises a variac 400 connected to a substrate heater 300 for providing power and controlling the time versus temperature profile of a substrate 500 and a component 510 on the substrate. The substrate may be a typical ceramic substrate or a resin impregnated fiberglass board, such as FR-4, normally used to mount electronic components. The substrate heater 300 is initially calibrated at a temperature of about 150° C. An IR camera 200 is mounted in a position to view the component 510 on the substrate 500, focusing on the component leads and substrate 500. The IR camera 200 is connected to a computer 100 that performs data logging measurements and analysis of pixel locations in an IR image from the IR camera 200 as the substrate 500 and component 510 are heated by adjusting a setting of the variac 400. The IR camera 200 is used to capture the gray level values that represent IR radiation signals at pixel locations in the IR image corresponding to leads of the component 510 and the substrate 500, at a rate of two samples per second. The resulting time profiles of the IR gray levels that represent IR radiation signals provide the basis for quantification of connection solderability. FIG. 2A through FIG. 2E show more detailed views of the substrate 500 with positioned components 510, 520, 530, 540, 550.

Figure 2A:
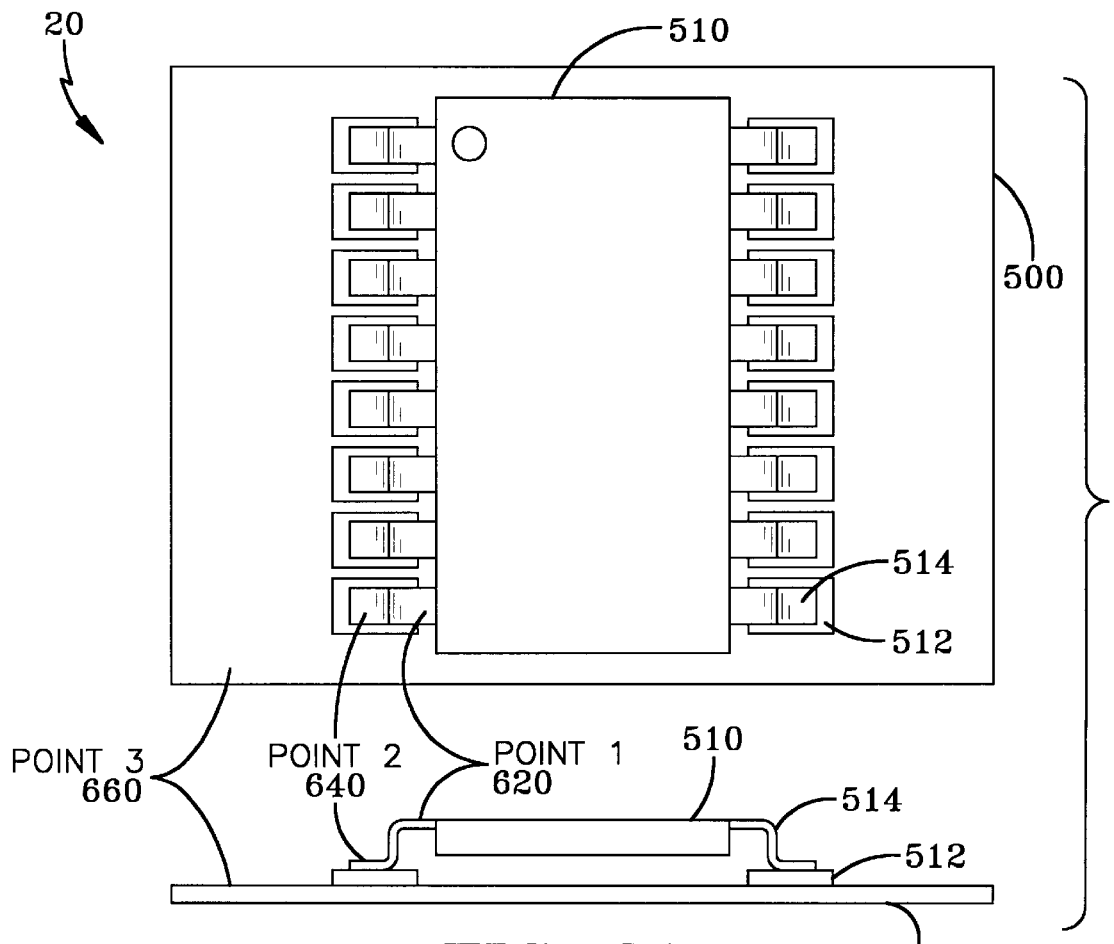
FIG. 2A through FIG. 2E shows a surface mount device positioned on a ceramic substrate and FIG. 2F shows a printed circuit board with solder pads.
Figure 2B:
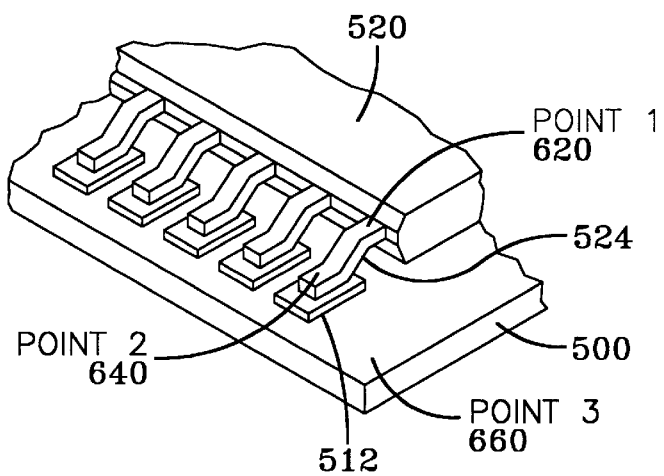
Figure 2C:
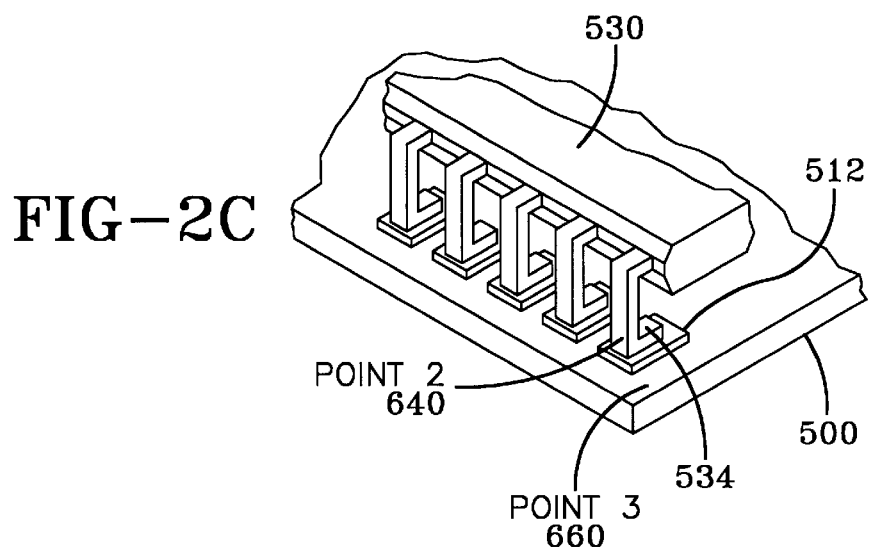
Figure 2D:
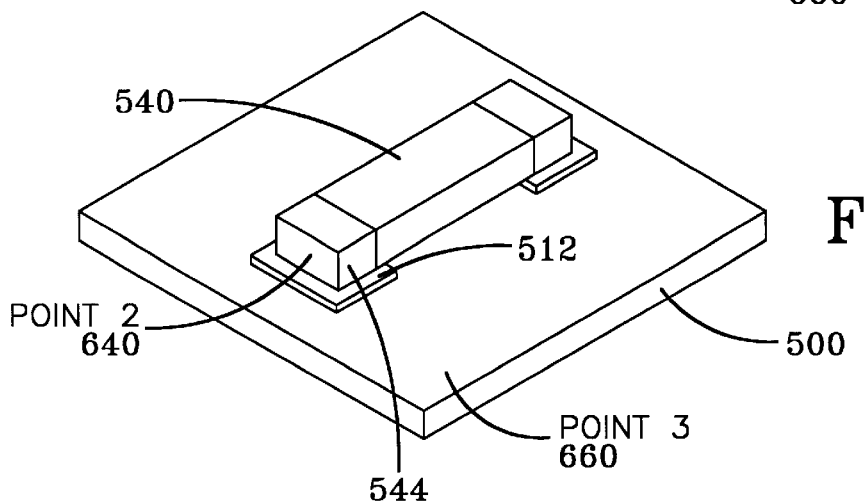
Figure 2E:
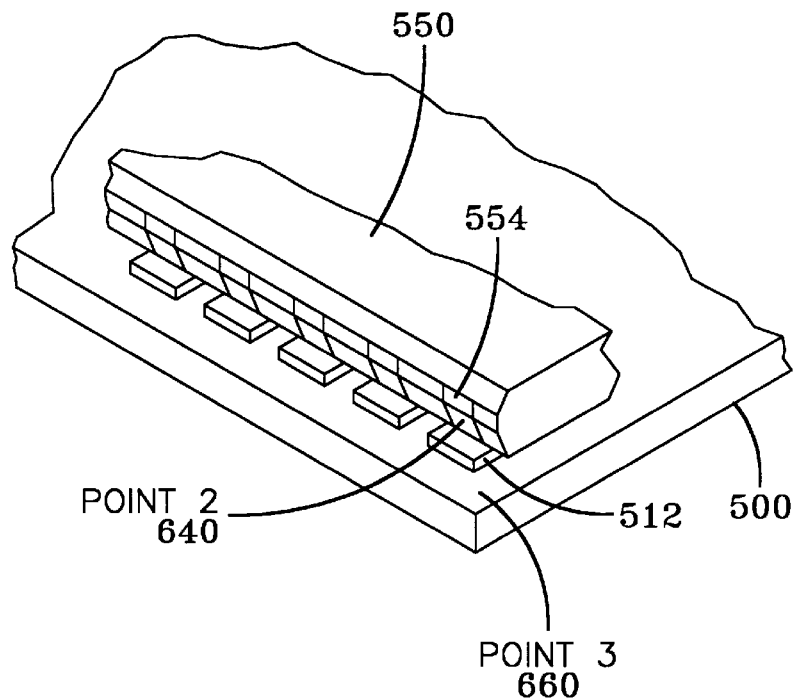
Figure 2F:
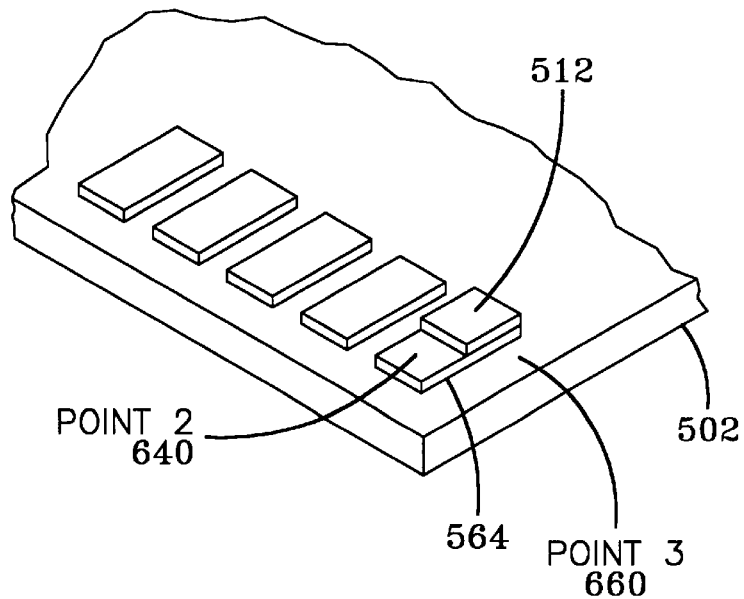

Turning now to FIG. 2A, FIG. 2A shows a detailed view of a configuration 20 encompassed in an IR image, in accordance with the present inventive concepts. The configuration 20 shows a substrate 500 prepared with one or more deposits of solder paste 512 positioned between at least one lead 514 of a component 510 and a surface of the substrate 500 or a solderable pad on the substrate. Pixel data are collected from the IR camera image at three location points. Pixel data is collected from Point 1 at the top of a component lead 620, from Point 2 at a surface of a component lead above a deposit of solder paste 640, and from Point 3 on a surface of the substrate 660, for use as a reference. The IR gray level value at a point in an image from the IR camera signify the IR radiation signal from that location on the surface of the component leads 514 or substrate 500. When the ambient (unheated) IR radiation signal from a surface is subtracted from the (heated) IR radiation signal from that surface, when heated, the resulting IR radiation signal difference is dependent only on the temperature, above ambient, of the surface and the emissivity characteristics of the surface. It is the emissivity prior to reflow and the variation in emissivity of the surface of the component connections during reflow when this surface is wetted by solder at Point 2, 640, as monitored by their IR radiation signal, that will be used in assessing the solderability of the component 510. The subsequent temperature profile of the Point 3, 660, on the heated substrate 500 approximates normal printed circuit board (PCB) assembly process conditions for soldering surface mount parts. The temperature profile will vary somewhat between different formulations of solder paste used for the deposits of solder paste 512. FIG. 2B depicts a gull-wing component 520 with at least one lead 524 positioned on a deposit of solder paste 512 that is deposited on the substrate 500. FIG. 2C depicts a J lead component 530 with at least one lead 534 positioned on a deposit of solder paste 512 that is deposited on the substrate 500. FIG. 2D depicts a leadless chip component 540 with at least one lead 544 positioned on a deposit of solder paste 512 that is deposited on the substrate 500. FIG. 2E depicts a leadless component 550 with at least one connection 554 positioned on a deposit of solder paste 512 that is deposited on the substrate 500. FIG. 2F depicts a printed circuit board substrate 502 with at least one solder pad 564 partially covered with a deposit of solder paste 512. Note that in FIG. 2C through FIG. 2F, IR pixel data is only collected at a point on the lead or connection that will be exposed to solder, Point 2, 640 and at a point on the substrate, Point 3, 660, because of the lack of a suitable point to collect IR data at a point on a lead or connection, Point 1, 620 that is not exposed to solder. It should also be noted that since some components are considered leadless, the solderable connections of these components will be considered leads for descriptive purposes in this specification. That is, the terms "connection" and "lead" shall be considered interchangeable for the purposes of this specification.

Turning now to FIG. 3, FIG. 3 shows a typical temperature profile 700 for solder reflow processing as recommended by a solder paste manufacturer, requiring about eight minutes for completion. As a component is heated and the temperature of the solder paste and component lead reaches approximately 150° C., 706, a duration of about two and a half minutes is required to evaporate solvents and to activate the flux in the solder paste. At about 183° C., 704, the solder in the solder paste reaches its melting point and is caused to melt. The temperatures of the substrate 500 is maintained between 183° C., 704, and 220° C., 702, for approximately one minute, where the temperature typically reaches a maximum of about 215° C., 708. After approximately one minute, the substrate, component, and solder paste are allowed to cool down to ambient temperature.

EXAMPLES

Figure 4A:
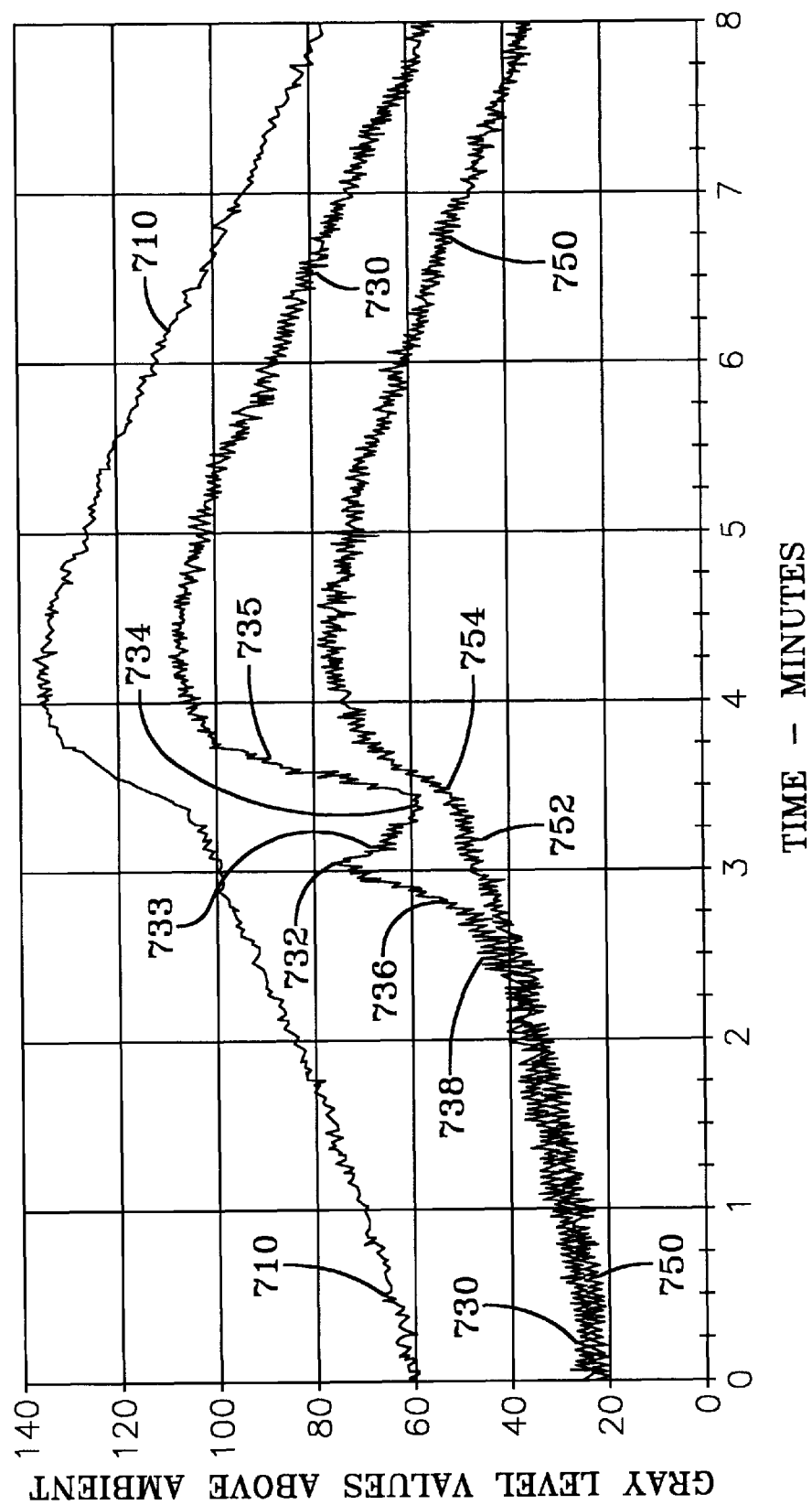
FIG. 4 through FIG. 6 show IR profiles indicative of acceptable solderability.
Figure 4B:
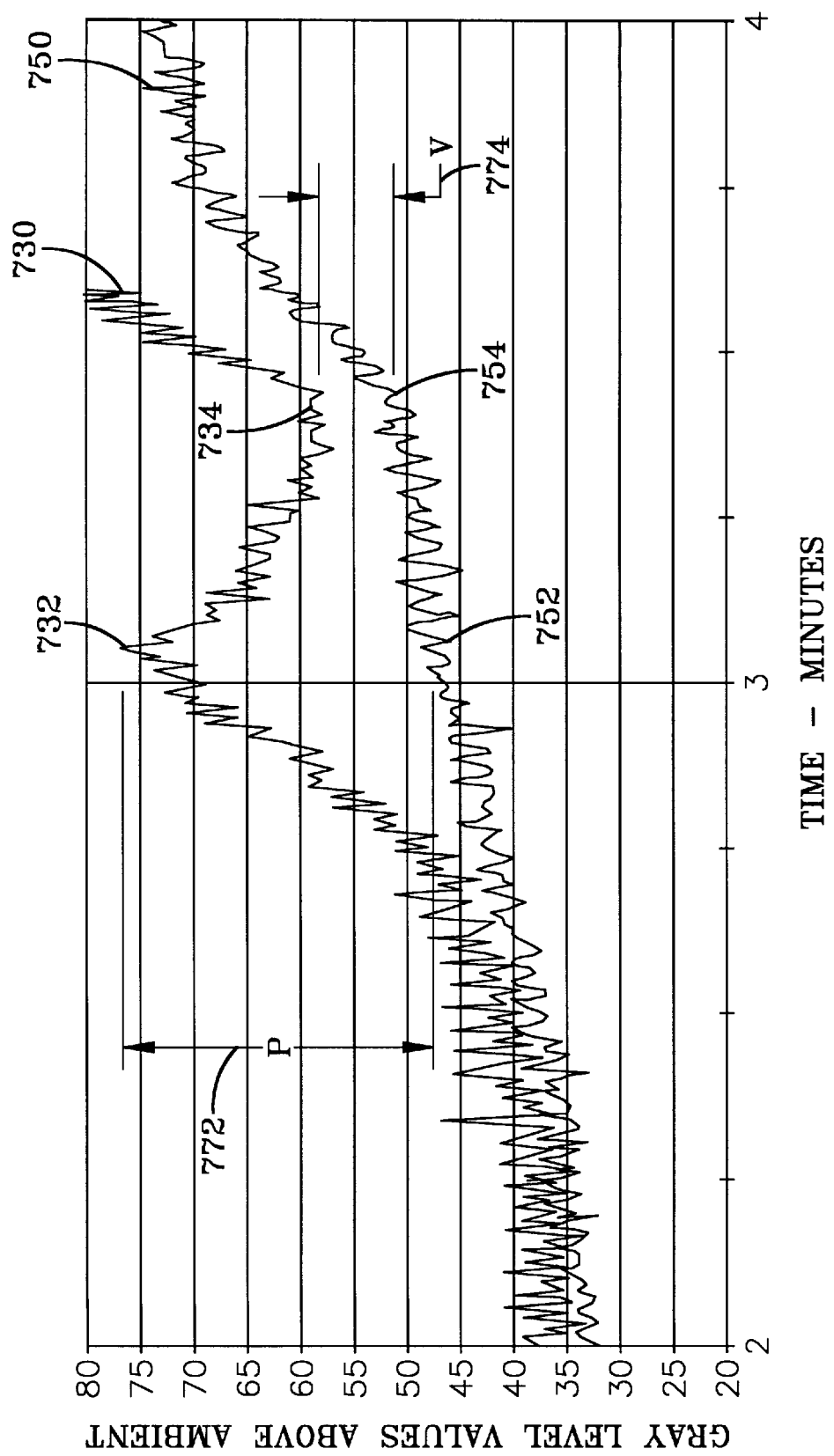

Turning now to FIG. 4A and FIG. 4B, FIG. 4A shows a set of IR camera gray level intensity measurements taken over a period of eight minutes for a first component lead in which the solderability is acceptable. For an approximate reference, the "0" minute time in FIG. 4A corresponds to approximately the "3" minute time in FIG. 3. The upper curve 710 represents an IR radiation signal taken at a heated substrate (Point 3, 660 in FIG. 2A through FIG. 2E) undergoing a typical temperature profile for a PCB during a surface mount soldering process on a PCB assembly manufacturing line. The middle curve 730 represents an IR radiation signal taken at a surface of a component lead adjacent to a deposit of solder paste (Point 2, 640 in FIG. 2A through FIG. 2E), where the emissivity is altered due to wetting by the solder flux and reflowed solder from the solder paste undergoing a typical temperature profile. The lower curve 750 represents an IR radiation signal taken at a top of a component lead not adjacent to a deposit of solder paste (Point 1, 620 in FIG. 2A and FIG. 2B), which is also being subjected to a normal temperature profile. The upper curve 710 is significantly higher than the middle curve 730 and the lower curve 750, which represent measurement locations on the metal component lead (514 in FIG. 2A). This difference in IR radiation signals is primarily due to the emissivity of the substrate material (typically, ceramic or FR-4) being higher than that of the surface of the metal lead. The lower curve 750 represents the IR radiation signal at a point on the component lead which does not wet with solder flux or reflowed solder during the temperature excursion. This lower curve 750 (Point 1, 620 in FIG. 2A and FIG. 2B) follows that of the upper curve 710 (Point 3), having essentially the same shape. The upper curve 710 and the lower curve 750 are indicative of the fact that the unscaled relative temperature trends closely match, but not the actual IR profilessince the emissivities of the two materials are not the same and have not been used to calibrate the IR profile to indicate their actual temperature. The middle curve 730 represents the IR radiation signal at a point located on the surface of the component lead that normally undergoes wetting by both the solder flux and molten solder during an acceptable soldering operation. The rapid increase in IR radiation signal 736 from an initiation point 738 on the curve 730 to a maximum or peak 732, followed by a rapid decrease 733 to a minimum or valley 734 is due to the rapid change in the emissivity at this point (Point 2, 640 in FIG. 2A through FIG. 2E) and not indicative of the actual temperature at this point. This rapid change 736 in the IR radiation signal profile from the initiation point 738 to a peak 732 is caused by the wetting of the component lead by the solder flux, causing a sudden rise in emissivity accompanied by a rapid rise in the IR radiation signal represented by an IR camera gray level, which is much faster than the actual temperature rise at the upper point on the component lead (Point 1, 620 in FIG. 2A and FIG. 2B), as indicated by the lower IR radiation signal 750. When the surface of the component lead is suddenly coated with molten solder, the emissivity of the surface at this point (Point 2, 640 in FIG. 2A through FIG. 2E) drops suddenly and the temperature tends to stabilize at this point due to the heat of fusion, which in turn causes the IR radiation signal measured at this point to decrease rapidly 733, resulting in a valley 734 in the IR radiation signal profile 730. Finally, when the solder is completely melted and the heat absorbed by the solder melting process (heat of fusion) ceases, causing the temperature at this point to increase, the IR radiation signal 735 rises rapidly to a higher level. The middle curve 730 then matches the shape of the upper curve 710 and the lower curve 750 from that time on through a subsequent substrate cool down period.

An important measurement for solderability assessment is the timing and magnitude of the rapid gyration in emissivity at the flux-wetted and solder-wetted component lead, accompanied by monitored behavior of the measured IR radiation signal. This characteristic represents a key element of the preferred embodiment of the present inventive concept. The parameters shown in FIG. 4A for distinguishing a component having acceptable solderability and a component having unacceptable solderability include (a) the presence of a peak 732 and a valley 734 in the IR radiation signal from a wetted part of a component lead, (b) the difference between the magnitude of the IR signals at the wetted part of a component lead 732 and the unwetted part of the component lead 752 at the time of the peak, (c) the time between the initiation point 738 and the peak 732, (d) the difference between the magnitude of the IR signals at the wetted part of a component lead 734 and the unwetted part of the component lead 754 at the time of the valley, and (e) the time between the peak 732 and the valley 734. Once these parameters have been used to characterize components with acceptable and unacceptable solderability, for determining acceptable solderability of components and solder paste of the same type, one need only compare the IR radiation signal of the substrate 710 with that of the lead, 730 or 750, for less than two minutes of the time shown in FIG 4A. The values of these parameters are dependent upon the reflow temperature profile of solder paste and the type of component used in the measurement, but are consistent and repeatable when using the same solder paste and component types. Once an initial characterization of the solder paste and the component type have been made to ascertain predetermined limit values, it is merely a matter of determining if the parameters above fall within predetermined limit values for any additional components of the same type and same solder paste temperature profile. These parameters may be ascertained either by visual observation of a plot of the IR signals versus time, or by converting and reading the values of the IR signal into a computer memory where a computer program analyzes the data using correlation analysis or similar signal processing techniques. The parameters from similar components may then be compared with the predetermined limit values either visually or by the use of a computer program in order to determine the acceptability or unacceptability of the solderability. For the purposes of identifying a peak and a valley, the time between the initiation point 738 and the peak 732 is less than one minute, and the time between the peak 732 and the valley 734 is less than one minute.

Although solderability may be determined by a number of different methods from the data represented by the curves of FIG. 4A, several key ratios provide a reliable solderability assessment. Referring to FIG. 4B, FIG. 4B shows an expanded view of the curves from FIG. 4A, which shows the IR radiation signals from the leads 730, 750, between two and four minutes. A peak magnitude P, 772, is a value measured between the IR radiation signals of the wetted part of the component lead 732 and the unwetted part of the component lead 752 taken at the time of the peak 732. A valley magnitude V, 774, is a value measured between the IR radiation signals of the wetted part of the component lead 734 and the unwetted part of the component lead 754 taken at the time of the valley 734. A peak ratio is determined by dividing the difference between the peak magnitude P, 772, and the valley magnitude V, 774, by the peak magnitude P, 772.

Peak Ratio=(P−V)/P

For the case of FIG. 4B, the peak ratio is approximately (30−8)/30 or 0.73. Referring to FIG. 4A, a lead/substrate ratio is determined by dividing the lead magnitude, 730 or 750, at a time between 0 and 2 minutes by the substrate magnitude 710 at the same time between 0 and 2 minutes. This lead/substrate ratio is approximately constant down to a substrate temperature of below 100° C. For the case of FIG. 4, the lead/substrate ratio at one minute is approximately 25/70 or 0.36.

Figure 5:
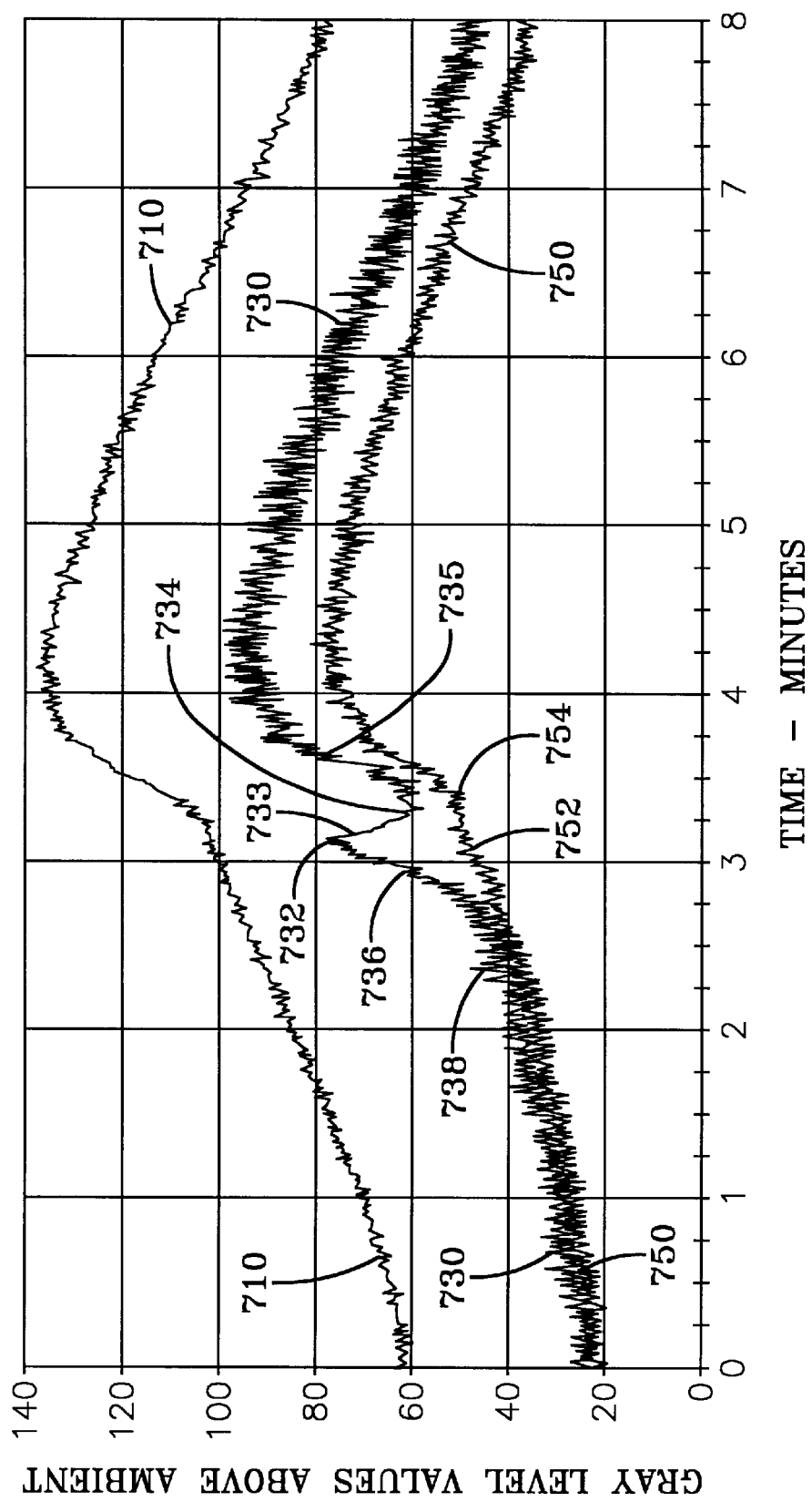

Turning now to FIG. 5, FIG. 5 shows a set of IR camera gray level intensity measurements taken over a period of eight minutes, for a second component lead in which the solderability is acceptable. The description of FIG. 5 is identical to that of FIG. 4, except for the computed values of the peak ratio and the lead/substrate ratio. For FIG. 5, the peak ratio is approximately 0.66 and the lead/substrate ratio is approximately 0.39.

Figure 6:
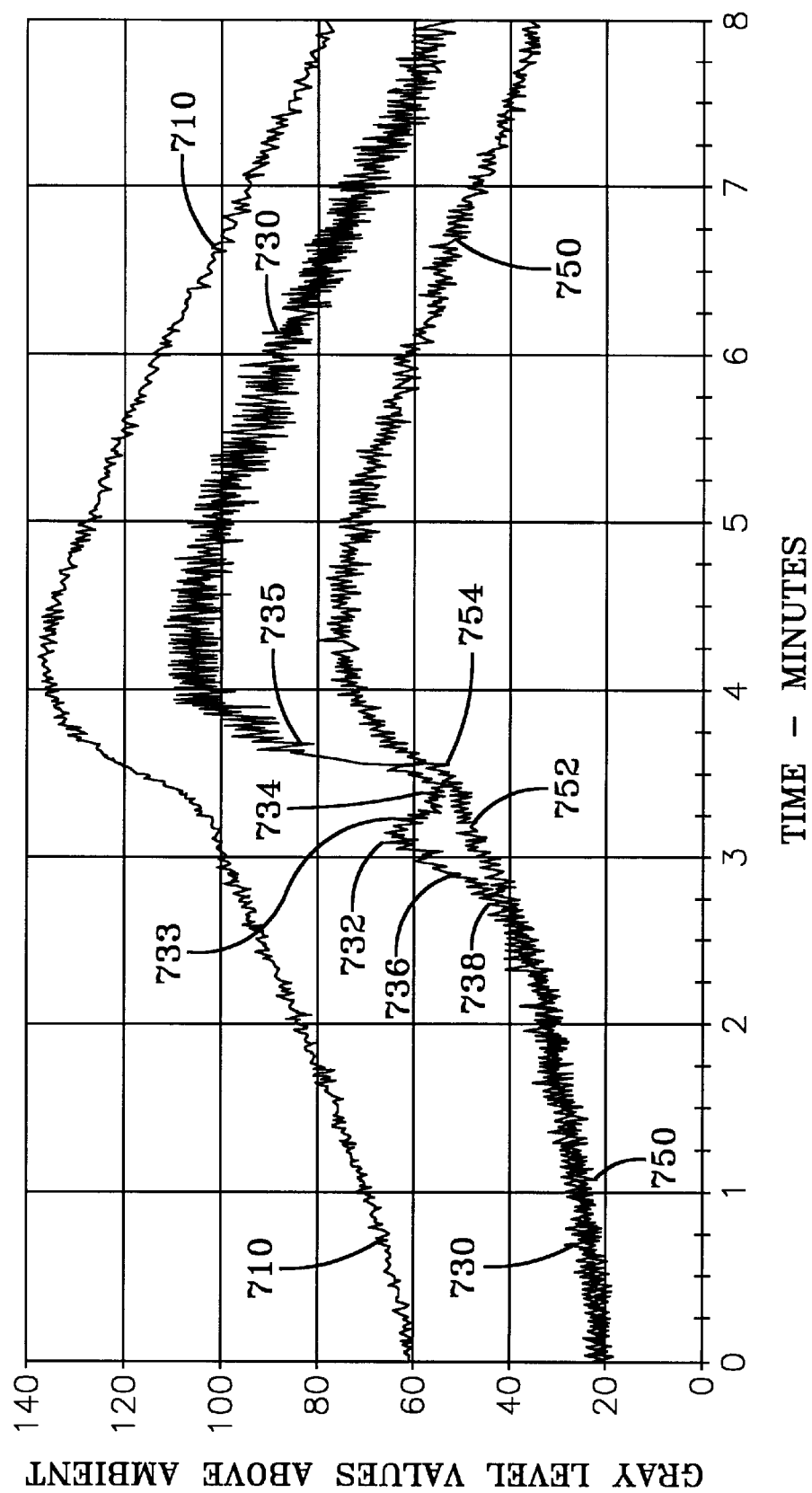
Figure 7:
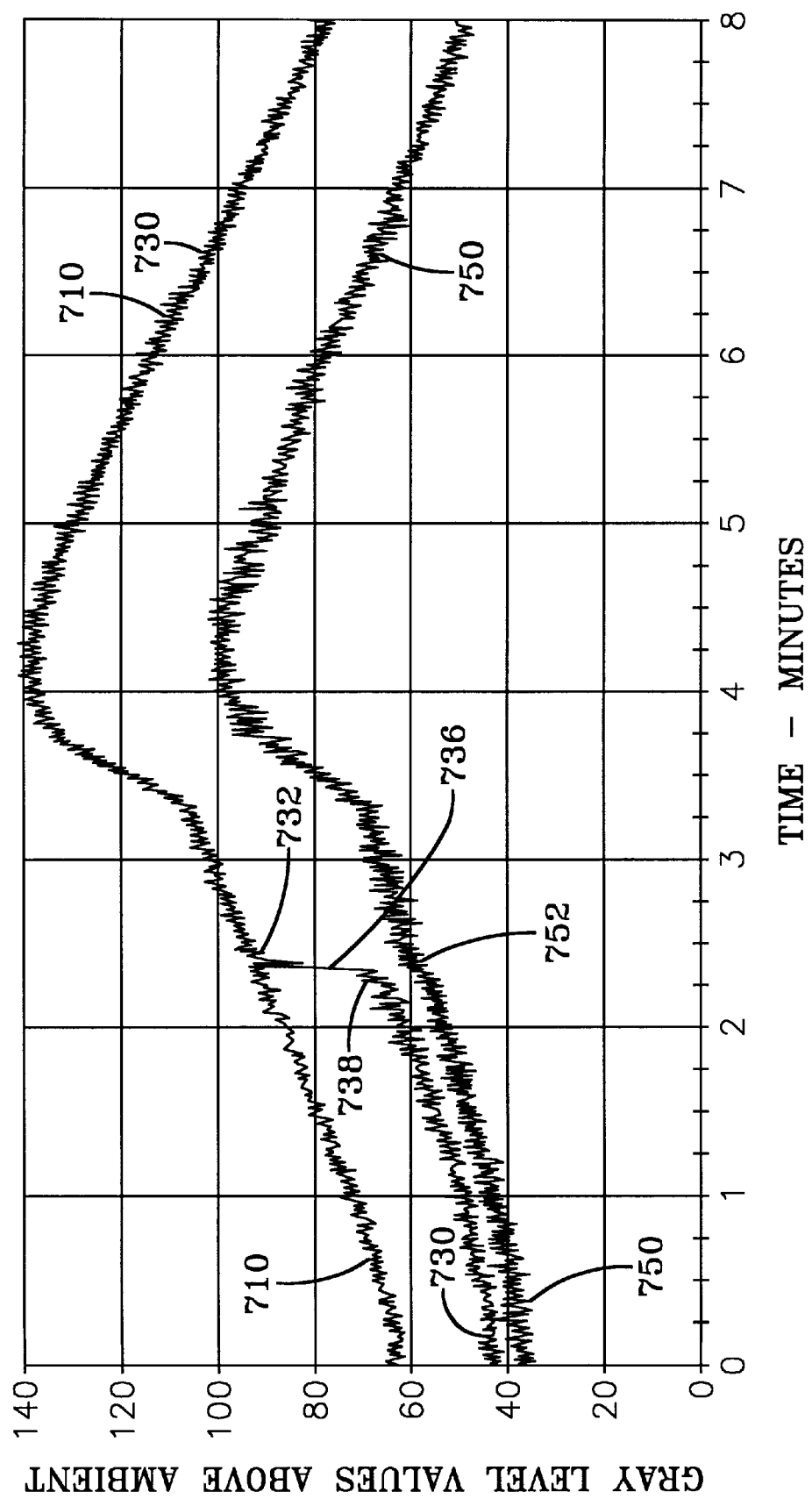
FIG. 7 through FIG. 9 show IR profiles indicative of unacceptable solderability.

Turning now to FIG. 6, FIG. 6 shows a set of IR camera gray level intensity measurements taken over a period of eight minutes, for a third component lead in which the solderability is acceptable. The description of FIG. 6 is identical to that of FIG. 4, except for the computed values of the peak ratio and the lead/substrate ratio. For FIG. 6, the peak ratio is approximately 0.80 and the lead/substrate ratio is approximately 0.36. Turning now to FIG. 7, FIG. 7 shows a set of gray level intensity measurements taken over a period of eight minutes by an IR camera, for a fourth component lead in which the solderability is not acceptable. In contrast with FIG. 4, FIG. 7 represents three similar IR radiation profiles, but where the component lead that has been intentionally treated to be unsolderable under typical manufacturing conditions. For an approximate reference, the "0" minute time in FIG. 7 corresponds to approximately the "3" minute time in FIG. 3. The upper curve 710 represents an IR radiation signal taken at a heated substrate (Point 3, 660 in FIG. 2A through FIG. 2E) undergoing a typical temperature profile for a PCB during a surface mount soldering process on a PCB assembly manufacturing line. The lower curve 750 represents an IR radiation signal taken at a top of a component lead not adjacent to a deposit of solder paste (Point 1, 620 in FIG. 2A and FIG. 2B), which is also being subjected to a typical temperature profile. The upper IR radiation signal 710 and the lower IR radiation signal 750 are similar to those corresponding curves in FIG. 4. However, the IR radiation signal represented by the middle curve 730 in FIG. 7 does not experience the gyration of a sudden peak and valley that was shown in FIG. 4. The middle curve 730 of FIG. 7 shows only a rise in the IR radiation signal 736 from an initiation point 738 to a peak 732 that accompanies the wetting of the component lead by solder flux. There is no indication of a dip in the IR radiation signal that would accompany the wetting of the lead by molten solder as in FIG. 4, because the solder is unable to coat or wet the treated lead. It should be noted that the same solder paste is used for determining the curves of FIG. 3 through FIG. 9. This lack of a peak followed by a valley in the curve representing a lead 730, located adjacent to a deposit of solder paste, is indicative of an unacceptable level of solderability. This characteristic represents a key element of the preferred embodiment of the present inventive concept. For the case of FIG. 7, the peak ratio is 0.0 the lead/substrate ratio is approximately 0.60.

Figure 8:
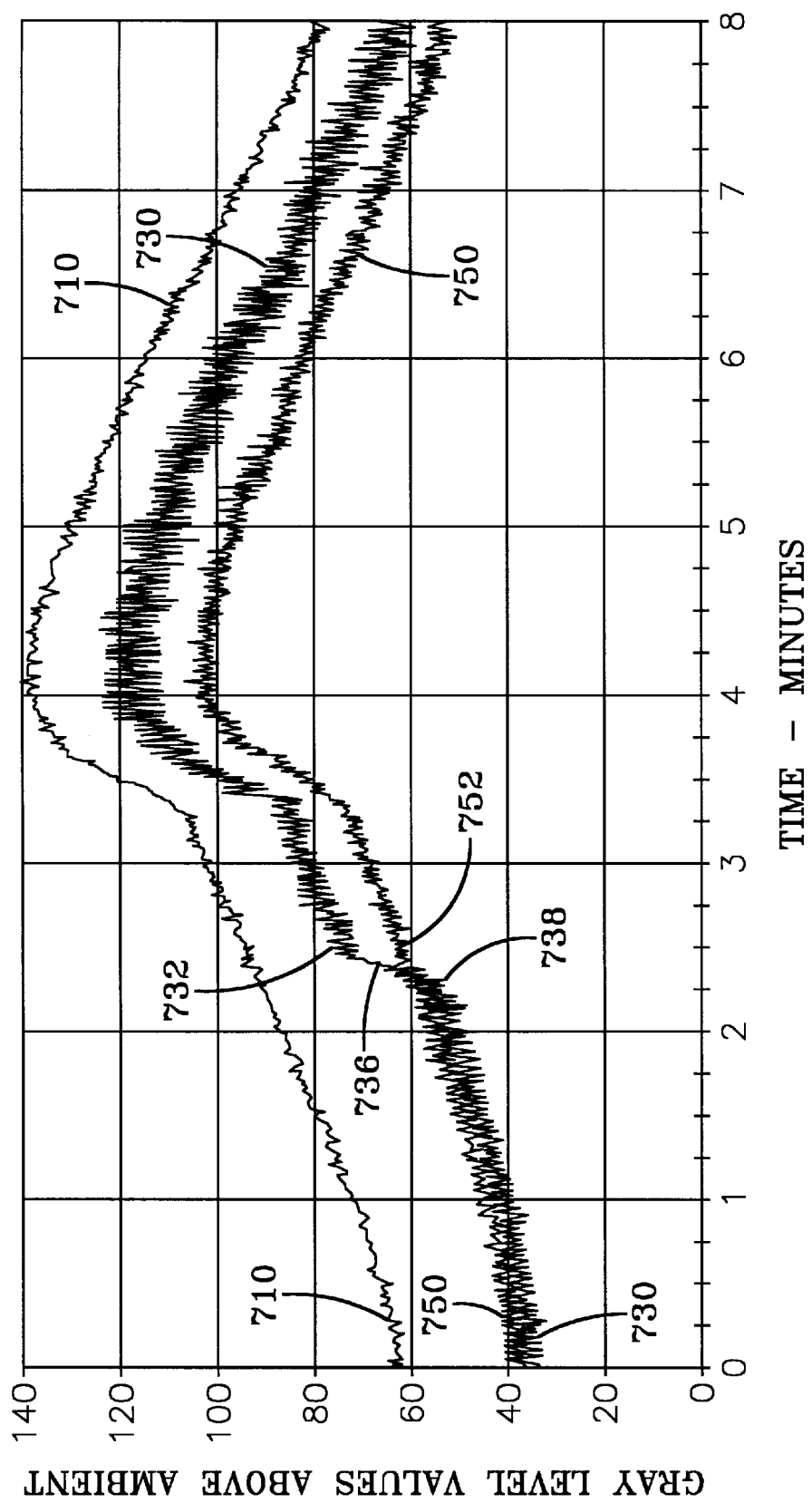

Turning now to FIG. 8, FIG. 8 shows a set of IR camera gray level intensity measurements taken over a period of eight minutes, for a fifth component lead in which the solderability is not acceptable. The description of FIG. 8 is identical to that of FIG. 7, except for the computed values of the lead/substrate ratio. For FIG. 8, the peak ratio is also 0.0 and the lead/substrate ratio is approximately 0.64.

Figure 9:
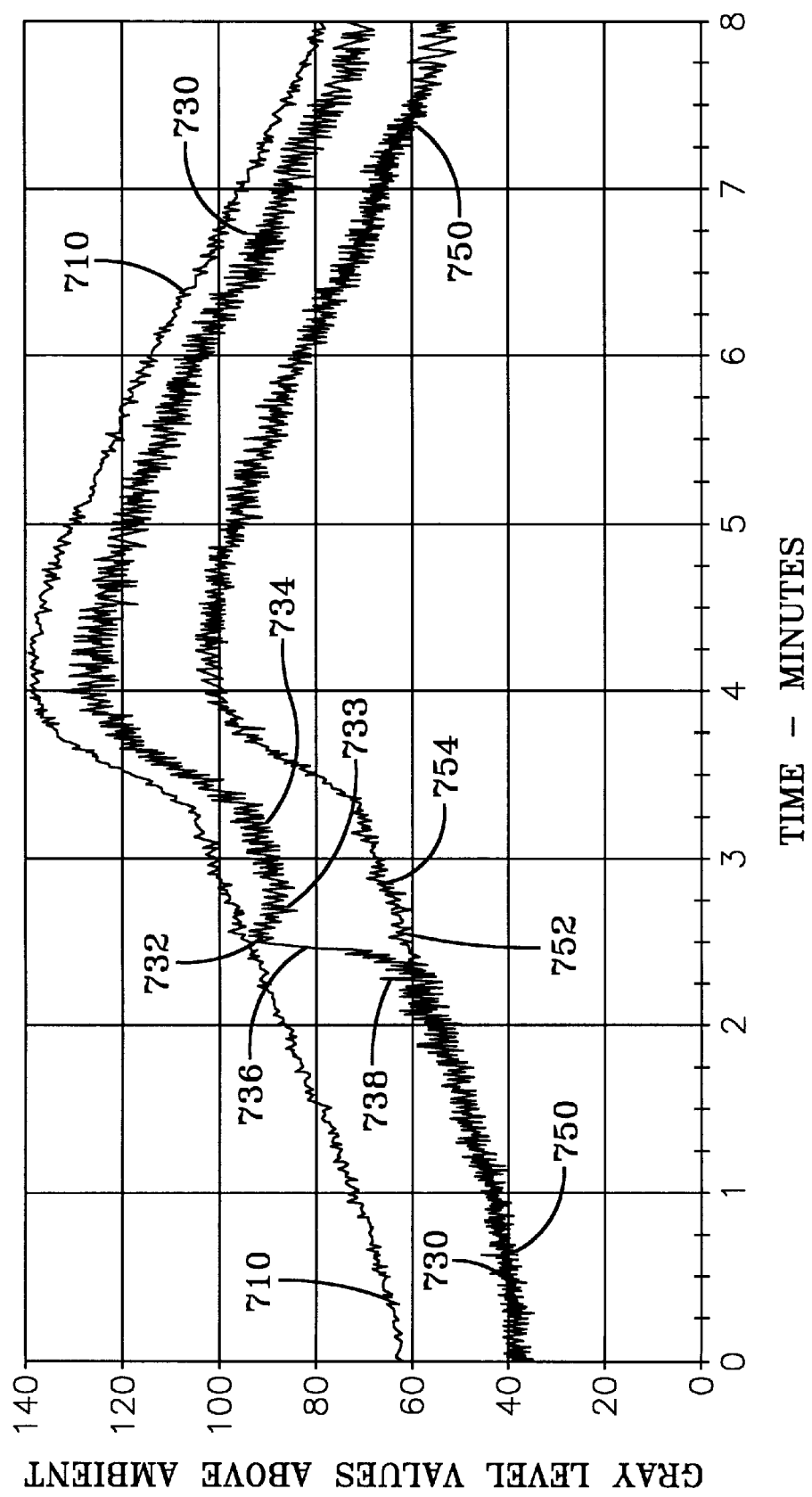

Turning now to FIG. 9, FIG. 9 shows a set of IR camera gray level intensity measurements taken over a period of eight minutes, for a sixth component lead in which the solderability is not acceptable. The description of FIG. 9 is similar to that of FIG. 7, except that there exists a slight valley in the middle curve 730 of FIG. 9. This slight valley is the result of a slight overlap of the pixel that represents the lead adjacent to the solder paste deposit with the molten solder adjacent to the lead. However, no solder wetted the component lead. For FIG. 9, the peak ratio is approximately 0.17 and the lead/substrate ratio is approximately 0.64.

Assessing Solderability

Table I shows a comparison of the computed values for the peak ratio and the lead/substrate ratio for the examples shown in FIG. 4 through FIG. 9. These ratios provide but two of a number of methods that may be used to assess the solderability of component leads. The data represented by FIG. 4 through FIG. 9 was taken using the same type of solder paste and components. It is apparent from the values shown in Table I that once a component type and solder paste have been characterized, either of the two ratios may be used in determining solderability. The range of peak ratios for components with acceptable solderability is between 0.66 and 0.80, while the same ratios for components with unacceptable solderability is between 0.00 and 0.17. Therefore, a range of peak ratios for components of the type tested with acceptable solderability may be greater than a value between 0.20 and 0.60, and a range of peak ratios for components with unacceptable solderability would be less than 0.20. A comparison the first two minutes shown of FIG. 4 through FIG. 9 and indicated by the lead/substrate ratio show that once a solder paste and a component type have been characterized by determining the peak and valley depicted in FIG. 4 through FIG. 9, one need only examine the first minute or two of the heating cycle for similar components, corresponding to a substrate temperature of less than 170° C., to determine the acceptability or unacceptability of a component. The lead/substrate ratio for a component having acceptable solderability, as shown in FIG. 4 through FIG. 6, is much less than the lead/substrate ratio for a component having unacceptable solderability, as shown in FIG. 7 through FIG. 9. This should be particularly noted for times of less than two minutes, representing a relatively low temperature. As shown in Table I, the range of lead/substrate ratios for times less than two minutes for components with acceptable solderability is between 0.36 and 0.39, while the same ratios for components with unacceptable solderability is between 0.60 and 0.64. Therefore, the range of lead/substrate ratios for components of the type tested with acceptable solderability would be less than a value between 0.40 and 0.60, and a range of lead/substrate ratios for components with unacceptable solderability would be greater than a value between 0.40 and 0.60.

TABLE I

| CHARACTERISTIC | FIG. 4 | FIG. 5 | FIG. 6 | FIG. 7 | FIG. 8 | FIG. 9 |
| --- | --- | --- | --- | --- | --- | --- |
| Peak Ratio | 0.73 | 0.66 | 0.80 | 0.00 | 0.00 | 0.17 |
| Lead/Substrate Ratio | 0.36 | 0.39 | 0.36 | 0.60 | 0.64 | 0.64 |

The substrate temperatures, and substrate emissivity curves 710 in FIG. 4 through FIG. 9 are essentially the same. Although not apparent, the lead temperatures whose emissivity is represented by curve 750 in FIG. 4 through FIG. 9 are also approximately the same. The difference is in the emissivities of the leads, due to oxides or other contaminants that inhibit solderability of the leads of the components characterized in FIG. 7 through FIG. 9. Thus, once a solder paste and a component type have been characterized to determine acceptable limit values for peak ratios and lead/substrate ratios, it is only necessary to compare the IR gray level signals from the substrate and a lead of a component of the same type for less than two minutes of the heating cycle to determine acceptable or unacceptable solderability of the component leads. The acceptability or unacceptability may be ascertained either by visual observation of a plot of the IR signals versus time, or by converting and reading the values of the IR signal into a computer memory where a computer program analyzes the data. The acceptability or unacceptability of the solderability may then be determined by comparing the IR signals with predetermined limit values for peak ratios and lead/substrate ratios, either visually of by the use of a computer program.

Figure 10:
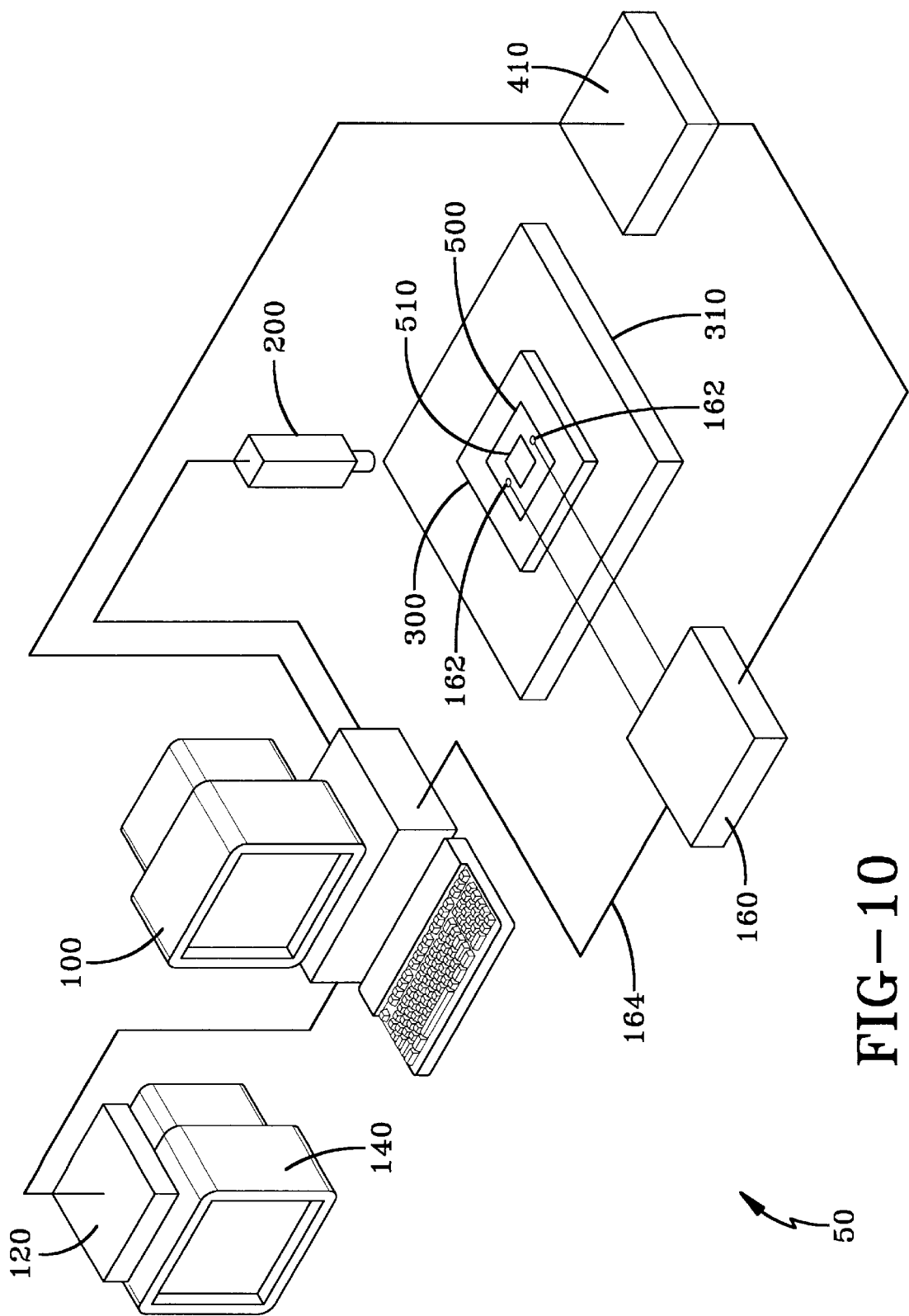
FIG. 10 shows a detailed configuration of an apparatus for assessing solderability.

Turning now to FIG. 10, FIG. 10 shows a detailed configuration of an apparatus for assessing solderability based on a measurement of a distinctive IR radiation signal of a solder reflow process during wetting of a soldered connection. An electronic component 510 is positioned on a substrate 500, which is mounted to an x-y positioning table 310 for alignment purposes. Two thermocouples 162 are also positioned on the substrate for temperature calibration purposes. The thermocouples 162 are connected to a data acquisition subsystem 160 that collects data and sends the data to a computer 100 over a serial connection 164, such as an RS-232 serial bus. The substrate 500 is positioned on a substrate heater 300, for heating the substrate 500 and component 510 to a desired temperature in a controlled manner. The temperature created by the substrate heater 300 is determined by a substrate heater power supply 410 that is connected to the substrate heater 300 and controlled by the computer 100. The output from the substrate heater power supply 410 is also connected to the data acquisition subsystem 160 for monitoring purposes. An IR camera 200 is mounted in a position to view the component 510 on the substrate 500, focusing on the leads of the component 510 and substrate 500. The IR camera 200 is connected to a computer 100 that performs data logging measurements and analysis of pixel locations in an IR image from the IR camera 200 as the substrate 500 and component 510 are heated under control of the computer 100 by adjusting an output of the substrate heater power supply 410. The IR camera 200 is used to capture the gray level values at pixel locations in the IR image corresponding to IR radiation signal at a lead of the component 510 and the substrate 500, at a rate of two samples per second. A video cassette recorder (VCR) 120 is connected to the computer 100 for recording the IR radiation signal data collected by the computer 100. The VCR 120 is connected to a video monitor 140 for viewing of data stored by the VCR 120.

Although the present invention has been described in considerable detail with reference to certain preferred embodiments thereof, other embodiments are possible. Therefore, the spirit and scope of the appended claims should not be limited to the description of the preferred embodiments herein.

What is claimed is:

1. An apparatus for assessing solderability, comprising:
   (a) a component having at least one lead positioned on a solder paste deposit on a substrate;
   (b) a substrate heater positioned under the substrate, the substrate heater for heating the substrate, the component, and the component lead;
   (c) an IR camera positioned in view of the substrate, the component and the component lead; and
   (d) a computer for determining a change in an IR radiation signal resulting from solder flux and from liquid solder wetting the contact lead, the computer connected with the IR camera.

2. An apparatus for assessing solderability, according to claim 1, further comprising a variac for manually adjusting a temperature of the substrate, the component, and the component lead the variac connected with a power source and the substrate heater.

3. An apparatus for assessing solderability, according to claim 1, further comprising a substrate heater power supply for automatically adjusting a temperature of the substrate, the component, and the component lead, the substrate heater power supply connected with a power source, the substrate heater, and the computer.

4. An apparatus for assessing solderability, according to claim 1, further comprising a data acquisition subsystem for monitoring temperature and substrate heater power, the subsystem connected to thermocouples on the substrate, an output of a substrate heater power supply, and the computer.

5. An apparatus for assessing solderability, according to claim 1, further comprising an x-y table supporting the substrate, the x-y table for positioning the component, the component leads, and the substrate in the view of the IR camera.

6. A method for assessing solderability, comprising:
   (a) positioning a component having at least one lead on a solder paste deposit on a substrate;
   (b) heating the component, the component lead, the solder paste deposit, and the substrate;
   (c) measuring an IR radiation signal at the component lead and the substrate; and
   (d) determining acceptable solderability by detecting a peak and a valley in the IR radiation signal resulting from solder flux and liquid solder wetting the component lead.

7. A method for assessing solderability, according to claim 6, wherein the heating step comprises measuring a temperature at the substrate and adjusting the power to the substrate heater under computer control for achieving a predetermined temperature profile.

8. A method for assessing solderability, according to claim 6, wherein the determining step comprises:
   (a) reading the IR radiation signals into a computer memory;
   (b) detecting a sudden peak followed by a sudden valley in the IR radiation signal;
   (c) determining if a peak magnitude value and a time from initiation of the sudden peak to the sudden valley are within predetermined peak limits; and
   (d) determining if a valley magnitude value and a time from the sudden peak to the sudden valley are within predetermined valley limits.

9. A method for assessing solderability, according to claim 8, further comprising:
   (a) computing a peak ratio value; and
   (b) comparing the peak ratio value to at least two predetermined peak ratio values.

10. A method for assessing solderability, according to claim 8, further comprising:
    (a) computing a lead/substrate ratio value; and
    (b) comparing the lead/substrate ratio value to at least two predetermined lead/substrate ratio values.

11. A method for assessing solderability, comprising:
    (a) characterizing a solder paste reflow profile and solderability acceptability and unacceptability of a component type during an initial time interval of a reflow temperature profile up to a maximum temperature of 170° C.;
    (b) determining predetermined upper and lower limits for an IR signal during the initial time interval of the temperature profile prior to reflow from a component lead with acceptable solderability and from a component lead with unacceptable solderability; and
    (c) comparing an IR signal from a component lead of other components of the same component type during the initial time interval with the predetermined IR signal limits for determining solderability acceptability or unacceptability.

12. A method for assessing solderability according to claim 11, wherein the characterizing step comprises:
    (a) reading the IR radiation signal from a component lead of the same component type into a computer memory;
    (b) detecting a sudden peak followed by a sudden valley in the IR radiation signal; and
    (c) determining acceptable solderability by determining if a peak magnitude value and a time from initiation of the sudden peak to the sudden valley are within predetermined peak limits, and if a valley magnitude value and a time from the sudden peak to the sudden valley are within predetermined valley limits.

13. A method for assessing solderability, according to claim 6, wherein the determining step comprises:
    (a) visually determining a peak magnitude value;
    (b) visually determining a valley magnitude value; and
    (c) computing a peak ratio.

14. A method for assessing solderability, according to claim 13, further comprising comparing the peak ratio to predetermined peak ratio limit values.

15. A method for assessing solderability, according to claim 14, wherein acceptable solderability is where the peak ratio is greater than a predetermined peak ratio limit value of between 0.20 and 0.60.

16. A method for assessing solderability, according to claim 6, wherein the determining step comprises:
    (a) visually determining a lead magnitude value at a temperature of less than 170° C.;
    (b) visually determining a substrate magnitude value at the temperature of less than 170° C.; and
    (c) computing a lead/substrate ratio.

17. A method for assessing solderability, according to claim 16, further comprising comparing the lead/substrate ratio to predetermined lead/substrate ratio limit values.

18. A method for assessing solderability, according to claim 17, wherein acceptable solderability is where the lead/substrate ratio is less than a predetermined lead/substrate ratio limit value of between 0.40 and 0.60.

19. A method for assessing solderability, according to claim 6, further comprising forming an IR image of the component lead and the substrate via an IR camera, before the step of measuring an IR radiations signal; and
    the IR image having gray level values at pixel locations, the pixel locations corresponding to locations on the lead and the substrate.

20. A method for assessing solderability, according to claim 19, wherein the measuring step further comprises capturing and storing in a computer memory the IR gray level values.

21. A computer-implemented method for assessing solderability from an IR radiation signal, comprising:
    (a) converting an IR radiation signal into a digital code, via a computer image digitizer;
    (b) reading the converted IR radiation signal;
    (c) detecting a sudden peak followed by a sudden valley in the converted IR signal;
    (d) determining if a peak magnitude value and a time from initiation of the sudden peak to the sudden peak are within predetermined limits;
    (e) determining if a valley magnitude value and a time from the sudden peak to the sudden valley are within predetermined limits; and
    (f) computing a peak ratio.

22. A computer-implemented method for assessing solderability, according to claim 21, further comprising the step of comparing the peak ratio to predetermined peak ratio limit values.

23. A computer-implemented method for assessing solderability, according to claim 22, wherein acceptable solderability is where the peak ratio is greater than a predetermined peak ratio limit value of between 0.20 and 0.60.

24. A computer-implemented method for assessing solderability from an IR radiation signal, comprising:

(a) converting an IR radiation signal into a digital code, via a computer image digitizer;

(b) reading the converted IR radiation signal;

(c) determining a lead magnitude value at a temperature of less than 170° C.;

(d) determining a substrate magnitude value at a temperature of less than 170° C.; and (e) computing a lead/substrate ratio.

25. A computer-implemented method for assessing solderability, according to claim 24, further comprising the step of comparing the lead/substrate ratio to predetermined lead/substrate ratio limit values.

26. A computer-implemented method for assessing solderability, according to claim 25, wherein acceptable solderability is where the lead/substrate ratio is less than a predetermined lead/substrate ratio limit value of between 0.40 and 0.60.

* * * * *